(12) United States Patent  
Park et al.

(10) Patent No.: US 9,362,421 B2
(45) Date of Patent: Jun. 7, 2016

(54) SEMICONDUCTOR DEVICE INCLUDING A SUPPORT STRUCTURE

(71) Applicant: SK hynix Inc., Icheon-si (KR)

(72) Inventors: Cheol Hwan Park, Icheon-si (KR); Dong Sauk Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 13/679,445

(22) Filed: Nov. 16, 2012

(65) Prior Publication Data

US 2013/0127013 A1 May 23, 2013

(30) Foreign Application Priority Data

Nov. 21, 2011 (KR) .......................... 10-2011-0121695

(51) Int. Cl.
*H01L 29/92* (2006.01)
*H01L 27/108* (2006.01)
*H01L 49/02* (2006.01)

(52) U.S. Cl.
CPC .......... *H01L 29/92* (2013.01); *H01L 27/10852* (2013.01); *H01L 28/91* (2013.01)

(58) Field of Classification Search
CPC . H01L 23/5223; H01L 27/0805; H01L 28/40; H01L 2924/3011; H01L 28/60

USPC .......................................................... 257/532
See application file for complete search history.

(56) References Cited

U.S. PATENT DOCUMENTS

| | | | | | |
|---|---|---|---|---|---|
| 6,013,548 | A | * | 1/2000 | Burns, Jr. | H01L 27/10823 257/E21.655 |
| 7,576,383 | B2 | * | 8/2009 | Cho | H01L 27/10852 257/306 |
| 2008/0003800 | A1 | * | 1/2008 | Lee | H01L 21/76895 438/597 |
| 2009/0008743 | A1 | * | 1/2009 | Lee | H01L 28/90 257/532 |

FOREIGN PATENT DOCUMENTS

| KR | 1020080010662 A | 1/2008 |
|---|---|---|
| KR | 1020100092221 A | 8/2010 |
| KR | 1020100138467 A | 12/2010 |

* cited by examiner

*Primary Examiner* — Allen Parker
*Assistant Examiner* — Long Le

(57) ABSTRACT

In a semiconductor device, a support wall is formed between storage nodes to more effectively prevent leaning of a capacitor, and the storage nodes are formed using a damascene process, which may increase a contact area between each storage node and a storage node contact.

20 Claims, 20 Drawing Sheets

(a)

(b)

SEMICONDUCTOR DEVICE INCLUDING A SUPPORT STRUCTURE

CROSS-REFERENCE TO RELATED APPLICATION

The priority of Korean patent application No. 10-2011-0121695 filed on 21 Nov. 2011, the disclosure of which is hereby incorporated in its entirety by reference, is claimed.

BACKGROUND OF THE INVENTION

Embodiments of the present invention relate to a semiconductor device including a capacitor and a method for manufacturing the same, and more particularly to a semiconductor device and a method for manufacturing the same, which can more effectively prevent a storage node of a capacitor from leaning and can increase a contact region between a storage node and a contact plug.

Generally, semiconductor devices for memory such as a Dynamic Random Access Memory (DRAM) have been designed to retain information such as data or program instructions.

Typically, a unit cell storing data includes one transistor and one capacitor. A capacitor contained in a DRAM element or the like includes a storage node, a dielectric layer, and a plate electrode.

In recent times, with the increasing integration of the semiconductor device, an allowable area per unit cell is reduced, such that many developers and companies are conducting research into various technologies capable of making a capacitor that occupies less surface area on a substrate.

A variety of methods have been used to increase capacitance, for example, a method for employing a dielectric layer having a high dielectric constant, a method for forming a storage node and a plate electrode that are formed of a metal layer having a high work function, and a method for increasing a surface area of the capacitor.

In order to enlarge the surface area of the capacitor, the height of a storage node needs to be increased. That is, in a semiconductor device to which precise critical dimension (CD) technology is applied, in order to assign capacitance requested by the capacitor within an allowed cell region, an aspect ratio of the capacitor needs to be increased. However, provided that the aspect ratio of the capacitor is increased, the number of leaning defects in a capacitor array may be increased, such that there is a high possibility of causing a bridge between neighboring storage nodes.

In addition, the conventional storage node formation method forms an interlayer insulation film, forms a storage node contact hole by etching a region in which the storage node is to be formed, and deposits an electrode material in the contact hole. However, the above-mentioned conventional storage node formation method has some problems. In more detail, if the aspect ratio of the contact hole is increased, it is difficult to etch lower portions of the hole. In addition, a contact region of the contact plug may be smaller than desired, possibly resulting in increased resistance.

BRIEF SUMMARY OF THE INVENTION

Various embodiments of the present invention are directed to providing a semiconductor device and a method for manufacturing the same that substantially obviate one or more problems due to limitations and disadvantages of the related art.

Embodiments of the present invention relate to a semiconductor device for more effectively preventing a capacitor from leaning and increasing a contact region between a storage node and a storage node contact, resulting in improved capacitance.

In accordance with an aspect of the present invention, a semiconductor device includes a first storage node, a second storage node spaced apart from the first storage node along a first direction, a third storage node spaced apart from the first storage node along a second direction crossing the first direction, the first, second and third storage nodes being included in a plurality of storage nodes, a support wall located between the first storage node and the third storage node so as to contact the first storage node and the second storage node and a dielectric layer and a plate electrode disposed in a storage node region, and in a space between the first and second storage nodes.

The support wall is formed to have a line-type barrier structure arranged along the first direction.

A width of a lower portion of each of the plurality of storage nodes is greater than the width of an upper portion of each of the plurality of storage nodes.

The storage node has a pillar-type structure in which a width of a lower portion of each of the plurality of storage nodes is greater than the width of an upper portion of each of the plurality of storage nodes.

The support wall is disposed on a first side of the first and second storage nodes, the semiconductor device further comprising a second support wall disposed on a second side of the first and second storage nodes opposite to the first side.

In accordance with another aspect of the present invention, a semiconductor device includes a first storage node and a second storage node spaced apart from each other by a predetermined distance, a support wall configured to contact sidewalls of the first storage node and the second storage node and a dielectric layer and a plate electrode located between the first storage node and the second storage node.

The support wall is configured to contact one sidewall of each of the first storage node and the second storage node. The support wall is formed to contact both sidewalls of each of the first storage node and the second storage node.

The support wall is formed to have a line-type barrier structure arranged along a first direction.

A width of a lower portion of the first and second storage nodes is greater than a width of an upper portion of the first and second storage nodes. The storage node has a pillar-type structure in which a width of a lower portion of the first and second storage nodes is greater than the width of an upper portion of the first and second storage nodes.

The support wall is disposed on a first side of the first and second storage nodes, and a second support wall is disposed on a second side of the first and second storage nodes opposite to the first side.

In accordance with another aspect of the present invention, a method for manufacturing a semiconductor device includes forming a mold layer over a lower structure including a storage node contact, removing linear first portions of the mold layer disposed between neighboring storage node regions along a first direction to form a first space, forming a support wall in the first space, removing second portions of the mold layer disposed between the storage node regions along a second direction perpendicular to the first direction to form a second space, forming a sacrificial isolation film in the second space, removing third portions of the mold layer disposed in the storage node region to form a trench exposing the storage node contact, forming a storage node in the storage node region, removing the sacrificial isolation film and sequentially forming a dielectric layer and a plate electrode over the storage node.

The method may further include, prior to forming the mold layer, forming an etch stop film over the lower structure.

The support wall comprises an insulating material with a lower selectivity ratio than a material of the mold layer.

The step of forming the storage node includes forming a conductive film over an inner surface of the trench disposed in the storage node region, forming an insulation film over the conductive film to fill the trench and etching the conductive film and the insulation film until the mold layer is exposed, thereby isolating the conductive film.

The step of forming the storage node includes forming a conductive film in the trench disposed in the storage node region and etching the conductive film until the mold layer is exposed, thereby isolating the conductive film.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers are used throughout the drawings to refer to the same or similar parts. A semiconductor device and a method for manufacturing the same according to embodiments of the present invention will hereinafter be described with reference to the appended drawings.

Figure 1:
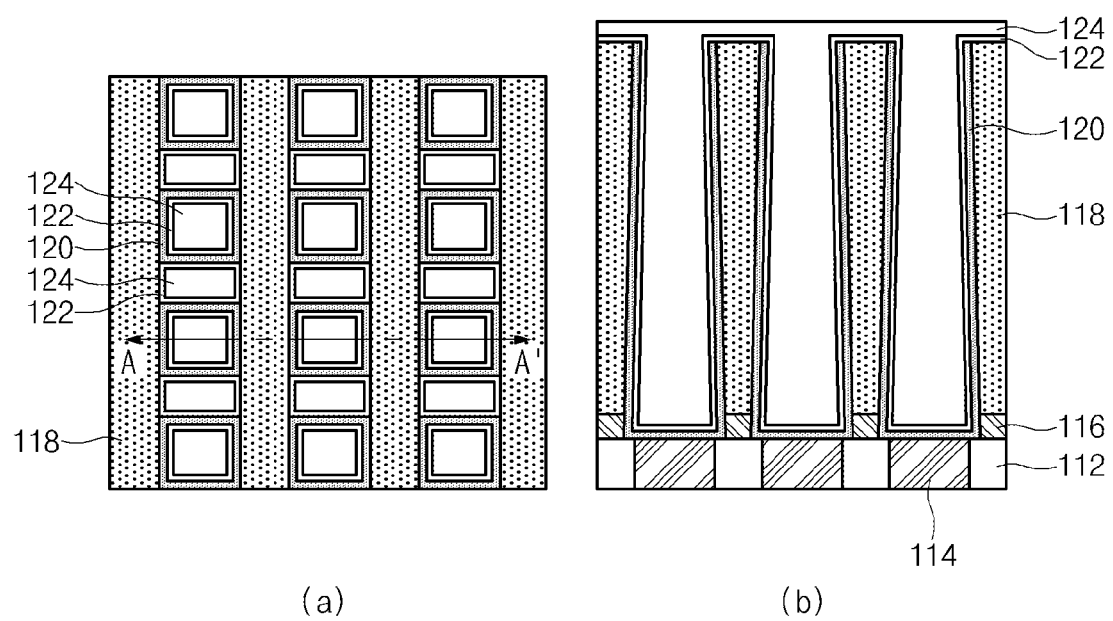
FIG. 1 illustrates a semiconductor device according to one embodiment of the present invention.

FIG. 1 illustrates a semiconductor device according to one embodiment of the present invention. FIG. 1(a) is a plan view illustrating the semiconductor device, and FIG. 1(b) is a cross-sectional view illustrating the semiconductor device taken along the line A-A' of FIG. 1(a).

Referring to FIG. 1, an interlayer insulation film 112 is formed over a lower structure such as a gate electrode (not shown) and a bit line (not shown), and a storage node contact 114 is formed in the interlayer insulation film 112. The storage node contact 114 is formed between bit lines (not shown), and is electrically coupled to an active region (not shown) of a substrate. In an embodiment, the storage node contact 114 may be electrically connected to an active region (not shown) of a substrate through a landing plug (not shown) formed between gate electrodes (not shown).

In the embodiment shown in FIG. 1, a storage node 120 of a capacitor is formed over the storage node contact 114. An etch stop film 116 and a support wall 118 configured to prevent leaning of the storage node 120 are formed between the storage nodes 120.

In an embodiment, storage node 120 disposed between support walls 118 may have a square profile as shown in FIG. 1. In other embodiments, the storage node 120 may have a rectangular profile or a circular profile so that the storage node 120 is a cylinder. Regardless of the geometric profile, an embodiment may include node structures that are wider at the base than the top, as seen in the storage node of FIG. 1. The larger width of the base portion of the storage node increases the surface area available to contact a storage node contact 114 disposed beneath the storage node 120, which may reduce alignment problems and contact resistance between a storage nodes 120 and storage node contacts 114. Because embodiments of the present invention are not made with a single-stage etching process, the dielectric layer 122 and the plate electrode 124 can be formed with a sufficient thickness to achieve adequate capacitance in a high aspect ratio capacitor.

The support wall 118 may be a line-type barrier structure formed along a first direction between storage nodes 120 spaced apart from each other by a predetermined distance. Although the support wall 118 may be formed to contact two sidewalls of the storage node 120 as shown in FIG. 1, in another embodiment the support wall 118 may be formed to contact only one sidewall of the storage node 120.

In addition, the dielectric layer 122 and the plate electrode 124 are formed not only over an outer sidewall of the storage node 120 not contacting the support wall 118 but also over an inner surface of the storage node 120, such that capacitor is formed. The plate electrode 124 formed over the support wall 118 is not shown in (a) of FIG. 1 for our convenience as well as your easy reference.

FIGS. 2 to 9 illustrate a method for manufacturing a semiconductor device according to an embodiment of the present invention. In each of FIGS. 2 to 9, (a) is a plan view illustrating the semiconductor device, and (b) is a cross-sectional view illustrating the semiconductor device taken along the line A-A' of each drawing (a).

Figure 2:
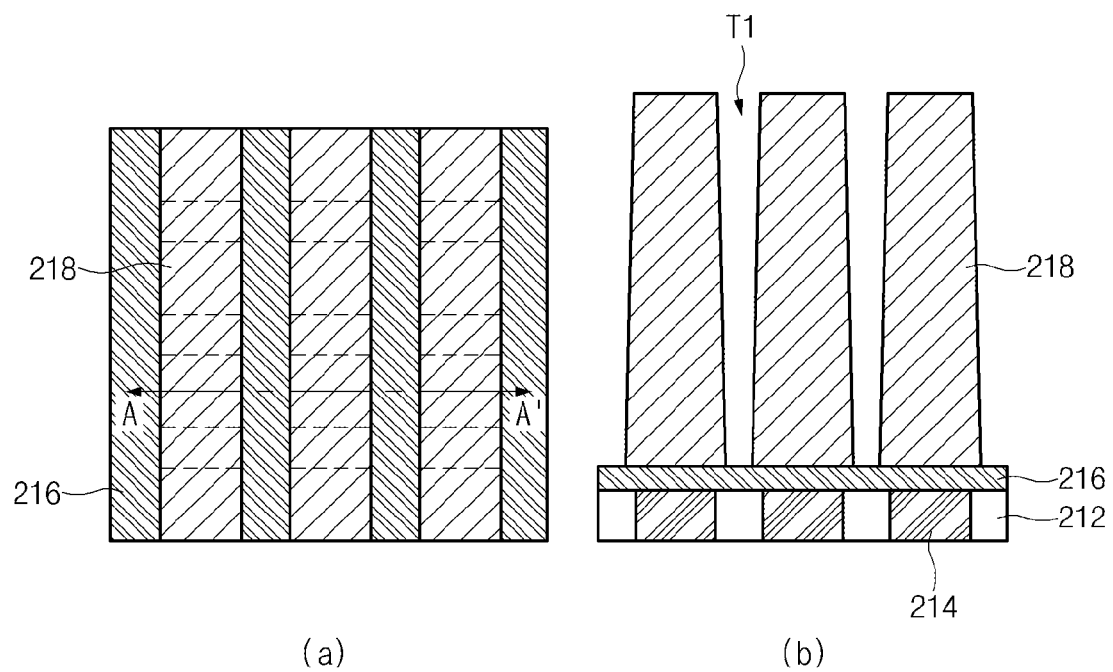
FIGS. 2 to 9 illustrate a method for manufacturing a semiconductor device according to an embodiment of the present invention.

Referring to FIG. 2, a lower structure that may include a gate electrode (i.e., word line, not shown), a landing plug (not shown), a bit line (not shown), an interlayer insulation film 212, and a storage node contact 214, is formed over a device isolation film defining the active region. In an embodiment, the storage node contact 214 is formed to expose its own top surface.

The lower structure may be manufactured using conventional methods, and as such a detailed description thereof will be omitted herein for convenience of description.

After forming the lower structure, an etch stop film 216 and a mold layer 218 are sequentially formed over a lower structure in which a top surface of the storage node contact 214 is exposed. Both of the etch stop film 216 and mold layer 218 may be formed as continuous layers.

In an embodiment, the etch stop film 216 may be formed of a nitride film, and the mold layer 218 may be formed of an oxide film. The mold layer 218 may be formed of BPSG (Boro Phospho Silicate Glass), PSG (Phospho Silicate Glass), TEOS (Tetra Ethyl Ortho Silicate oxide), HDP (High Density Plasma oxide), MTO (Middle Temperature Oxide), HTO (High Temperature Oxide), USG (Undoped silicate glass), and a silicon film, or a combination thereof.

Next, a photoresist pattern (not shown) defining a linear region (i.e., a first space region) running along the first direction and disposed between the storage node regions, which are denoted by dotted lines in FIG. 2, is formed over the mold layer 218. Subsequently, the mold layer 218 is etched until the etch stop film 216 is exposed using the photoresist pattern as an etch mask, resulting in formation of a trench T1.

Figure 3:
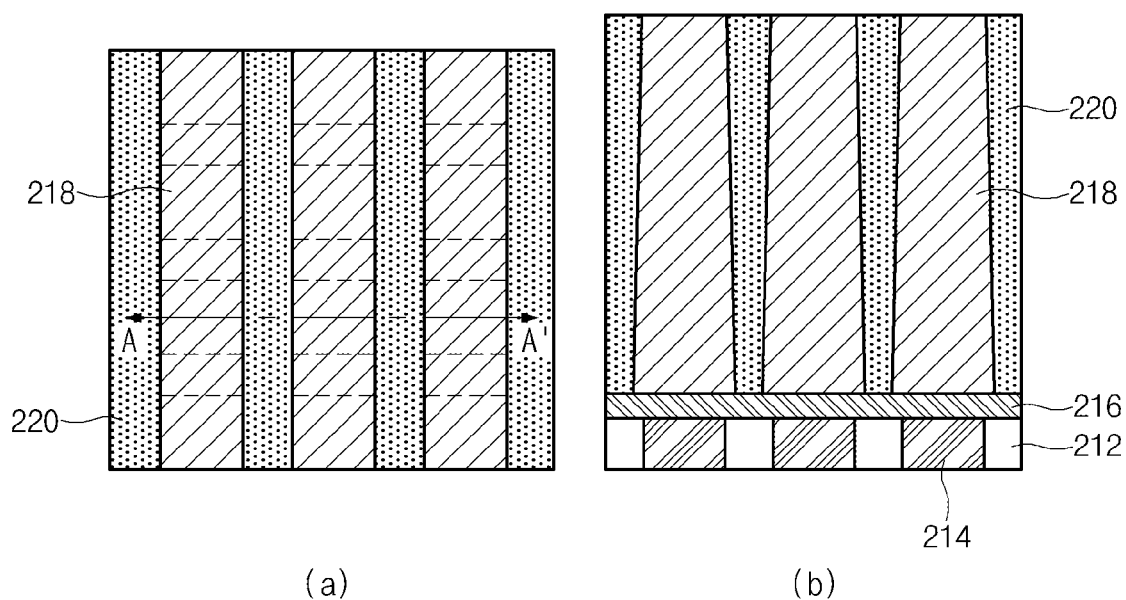

Referring to FIG. 3, an insulation film is formed to fill the trench T1. The insulation film is planarized until mold layer 218 is exposed, so that a support wall 220 is formed from the insulation film. In an embodiment, the support wall 220 may be formed of a material having an selectivity ratio lower than the material of mold layer 218. For example, the support wall 220 may be formed of $Si_3N_4$, SiBN, or SiCN.

Figure 4:
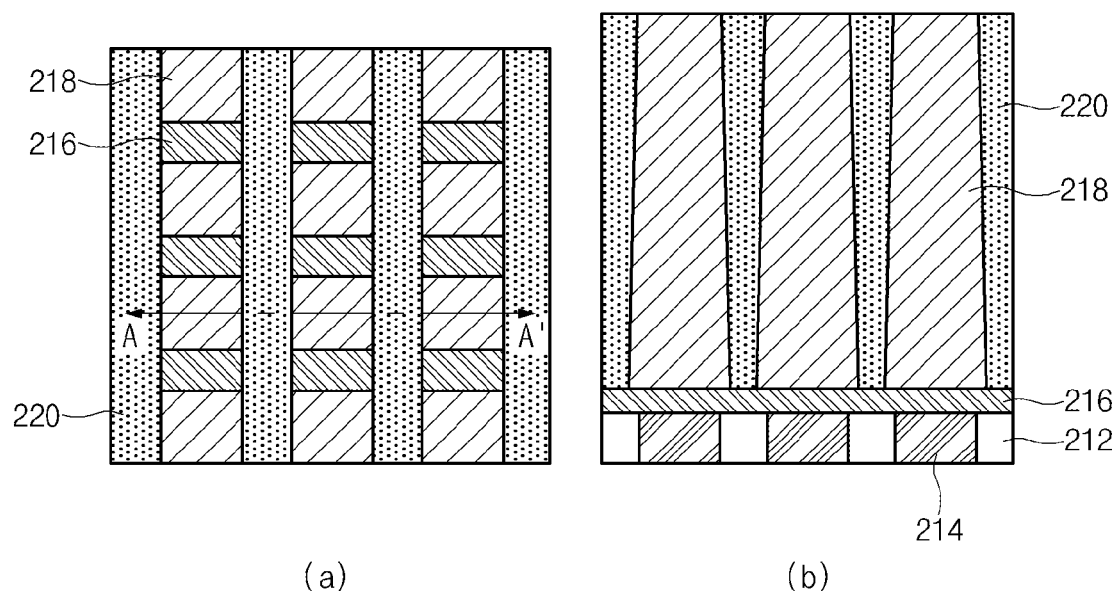

Referring to FIG. 4, the mold layer 218 is etched until the etch stop film 216 is exposed. Mold layer 218 may be etched using a line-type mask (not shown) running along a second direction crossing the first direction in a space between the storage node regions indicated by the dotted lines of FIG. 3, resulting in trenches (not shown). That is, the mold layer 218 of a region (i.e., a second space region) including no support wall 220 is selectively removed from spaces between the storage node regions.

In an embodiment, etching the mold layer 218 may be achieved using a selectivity ratio between the support wall 220 and the mold layer 218. That is, without using a hole mask defining the second space region, the mold layer 218 may be selectively removed using a line-type mask. In another embodiment, the mold layer 218 may be removed to create the structure shown in FIG. 4 using a hole mask, where the holes define areas to be removed.

Figure 5:
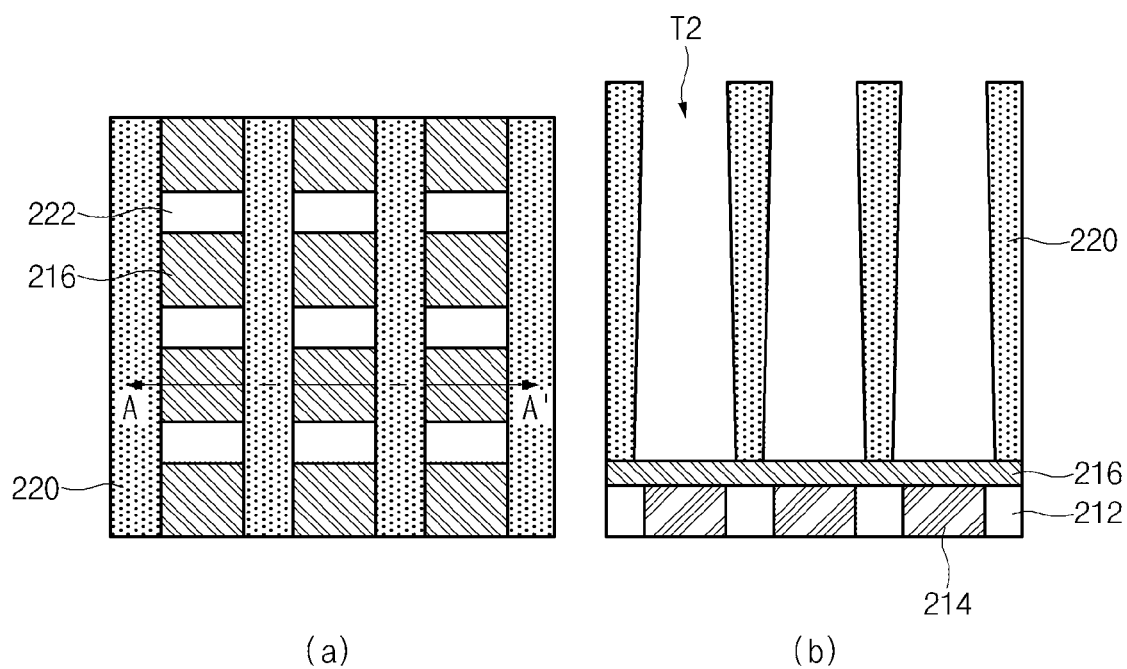

Referring to FIG. 5, a sacrificial isolation film 222 is formed to fill a trench of the second space region.

In an embodiment, the sacrificial isolation film 222 may be formed of a material with an selectivity ratio lower than the selectivity ratio of mold layer 218, and more susceptible to etching than the material used for support wall 220. For example, the sacrificial isolation film 222 may be formed of silicon, boron-doped silicon, or SiGe.

Subsequently, the mold layer 218 is removed to expose the etch stop film 216 using the selectivity ratio between the mold layer 218 and the support wall 220, and a selectivity ratio between mold layer 218 and the sacrificial isolation film 222, resulting in formation of a trench T2. In an embodiment, mold layer 218 is removed by a dip out process. A resulting width of a lower portion of trench T2 may be larger than a width of an upper portion of the trench. That is, in an embodiment, the storage node region of the mold layer 218 is not etched as a hole type, but the support wall 220 and the sacrificial isolation film 222 are firstly formed in the space region using a damascene process, and the mold layer 218 of the storage node region is then removed using the selectivity ratio.

In the related art, a lower portion of storage nodes has become smaller in response to the increasing aspect ratio of the storage node. As the size of the lower portions is reduced, deposition gas is insufficiently transmitted when forming the dielectric layer and the plate electrode, such that the dielectric layer and the plate electrode are defective. As a result, conventional techniques may have unacceptably high defect rates above a certain aspect ratio.

However, by using a damascene process according to embodiments of the present invention, a sufficient-sized hole CD of the lower part of the storage node can be obtained, resulting in formation of a stable structure with adequate capacitance at high aspect ratios.

Figure 6:
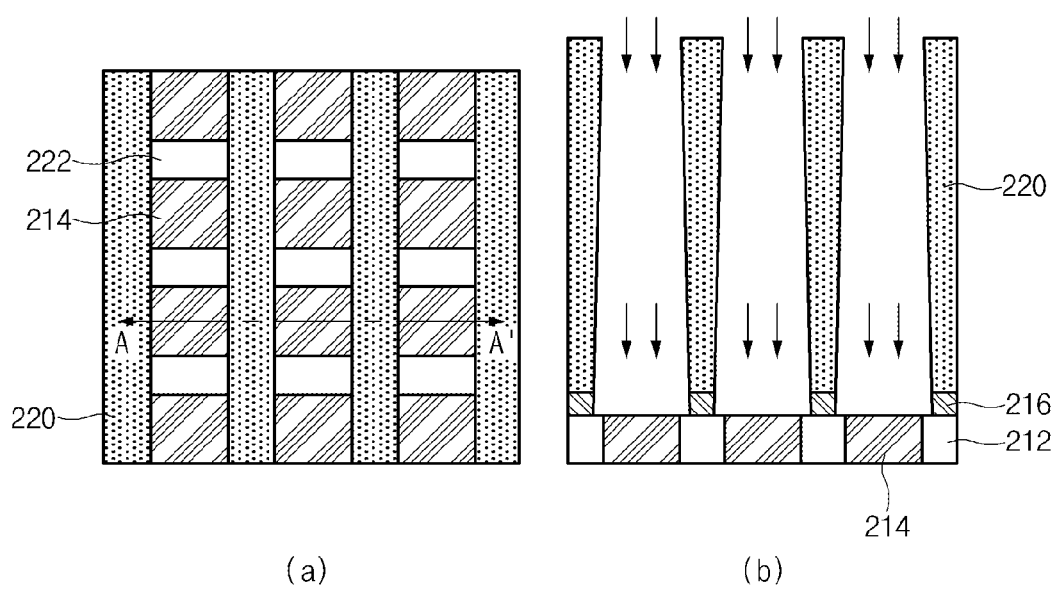

Referring to FIG. 6, the etch stop film 216 exposed through the trench T2 is removed such that storage node contact 214 is exposed. In an embodiment, the etch stop film 216 may be removed by a dry etching process.

Subsequently, in an embodiment where the storage node contact 214 is formed of a low conductivity material such as polysilicon, in order to reduce contact resistance between the storage node to be formed in a subsequent process and the storage node contact 214, titanium (Ti) may be deposited on the exposed storage node contact 214 using a method such as Chemical Vapor Deposition (CVD). Thermal processing may then be applied, such that a TiSix film is formed. In an embodiment, if the storage node contact 214 is formed of metal, the step of forming the TiSix film may be omitted.

Figure 7:
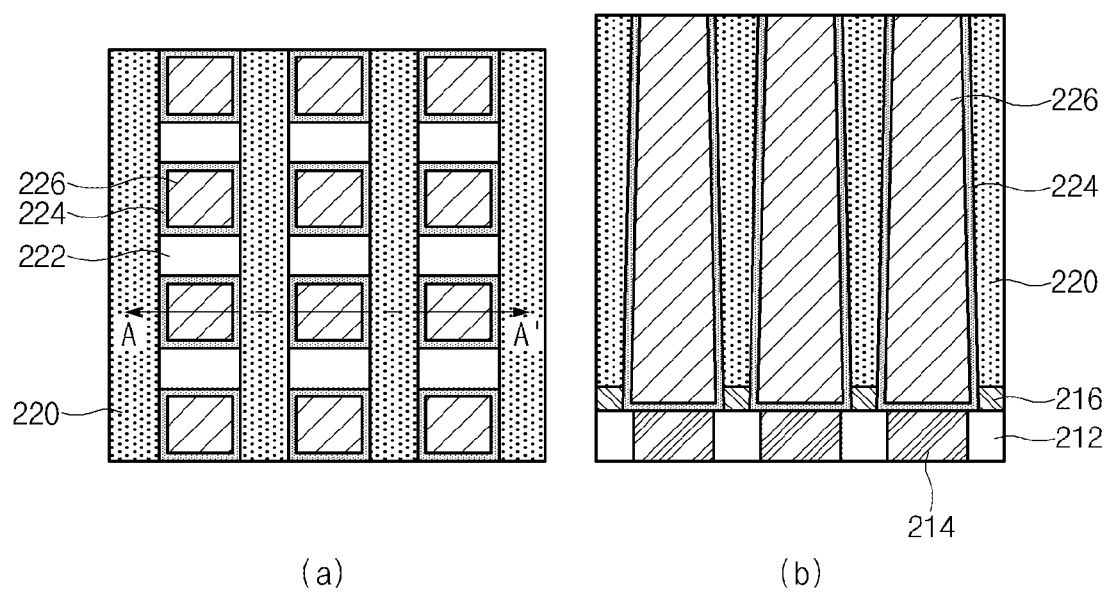

Referring to FIG. 7, the conductive film 224 to be used as a storage node of the capacitor is formed over inner surfaces of the trench T2 including the lower surface of the trench, so that the conductive film 224 is electrically coupled to storage node contact 214. For example, a titanium nitride (TiN) film may be deposited over an inner surface using the CVD method. In an embodiment, as discussed above, a layer of TiSix may be present between the storage node contact 214 and the conductive film 224.

Then, an insulation film 226 is formed over a conductive film 224, filling the trench T2. Next, the insulation film 226 and the conductive film 224 are etched and/or planarized using an etchback process, CMP process, or a similar technique until the support wall 220 is exposed, such that the conductive film 224 in a capacitor is isolated from the conductive film 224 of neighboring capacitors by removing an upper portion of the film that may remain over an upper surface of support wall 220. The resultant isolated conductive film 224 serves as an electrode of a storage node. In an embodiment, the insulation film 226 may be an oxide film.

Figure 8:
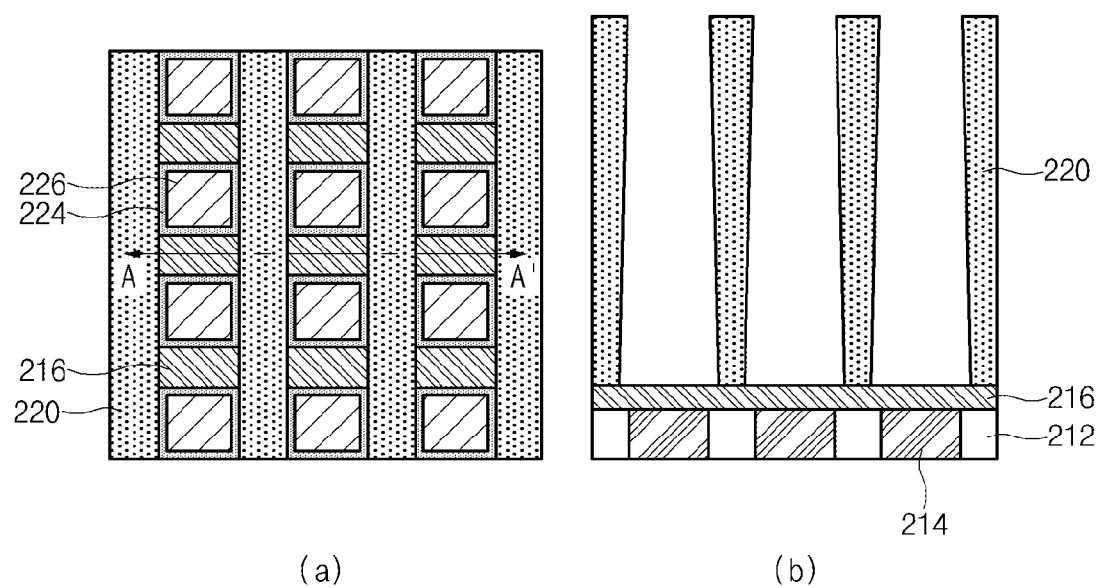

Referring to FIG. 8, the sacrificial isolation film 222 formed in the second space region is removed. In an embodiment, the sacrificial isolation film 222 is removed by a wet dip process.

Figure 9:
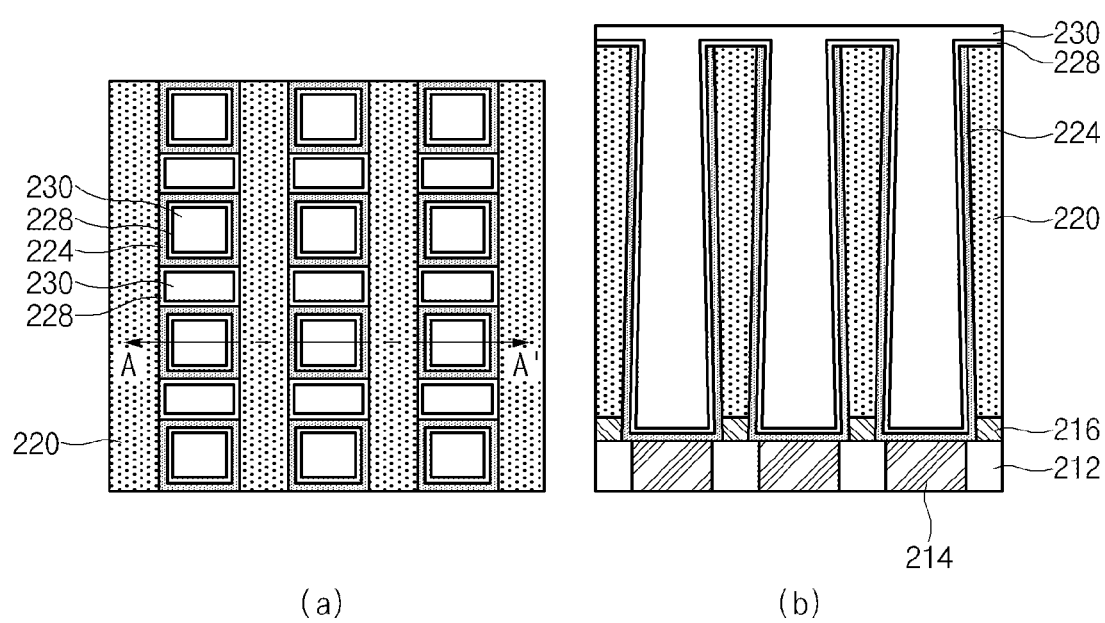

Referring to FIG. 9, the insulation film 226 formed over the conductive film 224 is removed. In an embodiment, the insulation film 226 is removed by a wet dip process. Subsequently, a dielectric layer 228 is deposited over exposed portions of conductive film 224, for example by using an Atomic Layer Deposition (ALD) process. As shown in FIG. 9, dielectric layer 228 is formed over all exposed surfaces, including a lower surface and sidewalls of the hole, as well as over an upper surface of support wall 220 between neighboring capacitors. In various embodiments, dielectric layer 228 may be formed of a dielectric material such as barium strontium (BST), $Ta_2O_5$, $Al_2O_3$, $HfO_2$, or the like.

Then, a conductive film such as a TiN film is formed over the dielectric layer 228, resulting in formation of a plate electrode 230. The plate electrode 230 formed over the support wall 220 is not shown in (a) of FIG. 9 for our convenience as well as your easy reference.

As can be seen from FIG. 7, a conductive film is deposited to a predetermined thickness over an inner surface of the trench T2 in such a manner that the conductive film contacts the storage node contact 214, thereby forming a storage node. However, in an embodiment, a conductive film is formed to fill the trench T2 to form a pillar-type storage node in which a width of a lower portion is larger than a width of an upper portion as shown in FIG. 10.

As used herein, the term "pillar-type" refers to the shape of a storage node. A pillar-type storage node is characterized by a lower electrode which protrudes outward from a surface of a semiconductor, so that it generally resembles a pillar. An exemplary pillar-type structure can be seen in FIG. 10. In contrast, other embodiments may be "concave-type."

Figure 20:
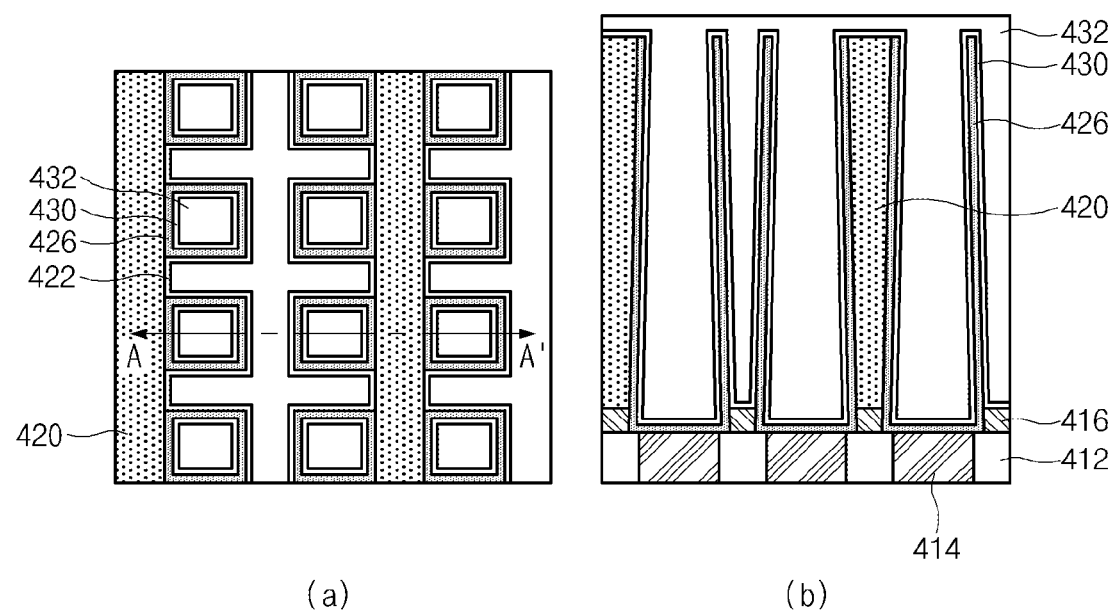

As used herein, the term "concave-type" also refers to the shape of the lower electrode. A concave-type electrode can be described as an indented, or female electrode in contrast to a protruding male pillar-type electrode. A lower electrode of a typical concave-type electrode is characterized by thin walls disposed over inner surfaces of a trench or cavity. The lower electrode of a concave-type storage node generally resembles a concavity in a surface of a semiconductor. Exemplary concave-type structures are shown in FIG. 1, FIG. 11, and FIG. 20.

Figure 10:
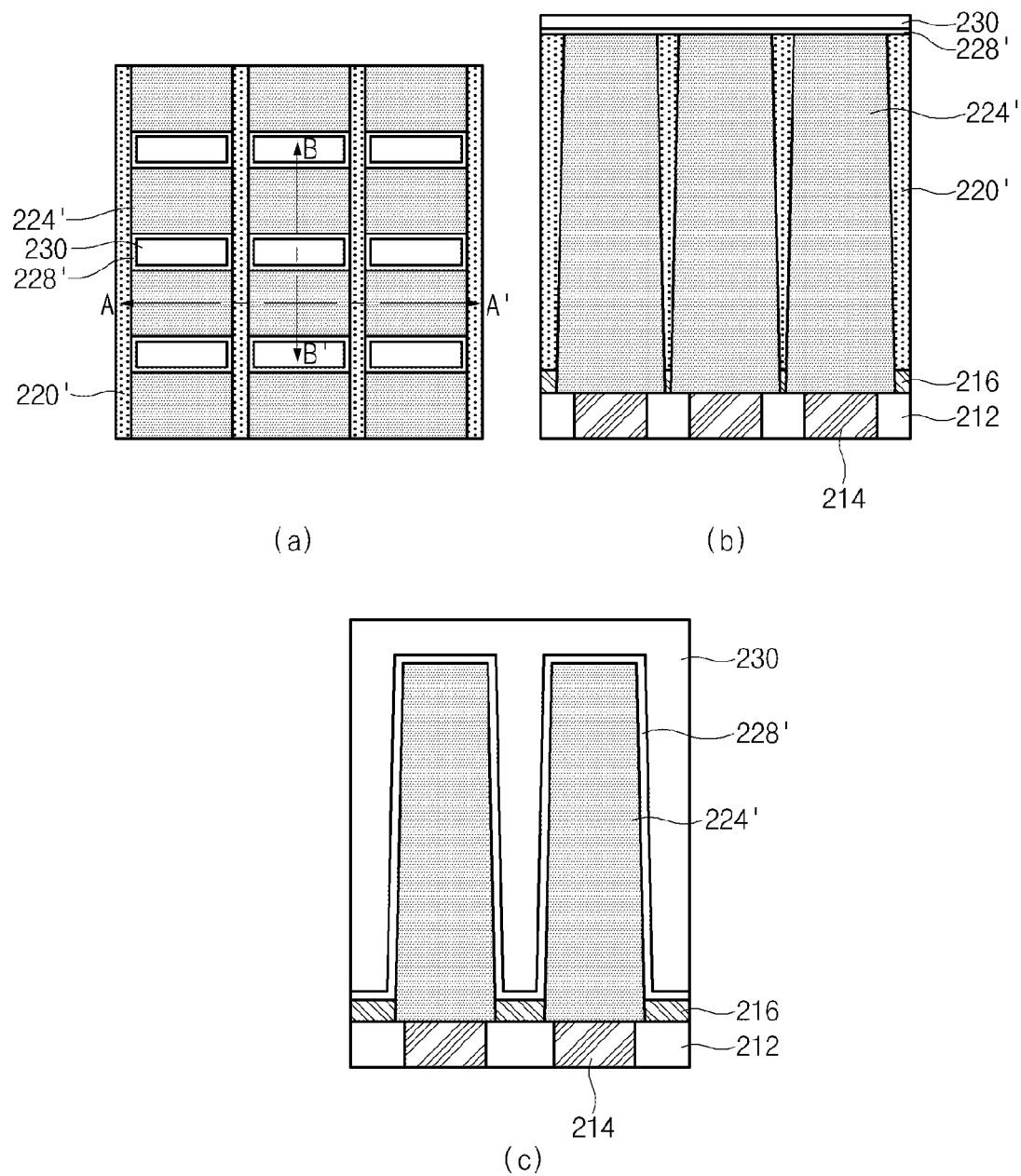
FIG. 10 illustrates a pillar-type storage node according to another embodiment of the present invention.

FIG. 10 illustrates a pillar-type storage node according to another embodiment of the present invention. FIG. 10(a) is a plan view illustrating another embodiment of the present invention, FIG. 10(b) is a cross-sectional view taken along the line A-A' of FIG. 10(a), and FIG. 10(c) is a cross-sectional view taken along the line B-B' of FIG. 10(a). A dielectric layer 228' and a plate electrode 230 formed over a storage node 224' are not shown in (a) of FIG. 10 for our convenience as well as your easy reference.

If the storage node is formed as a pillar-type structure, the dielectric layer 228' may be formed only on the upper surface and two sidewalls of lower electrode 224', such that capacitance may be lower than a concave-type storage node because of the lower surface area. However, the pillar-type storage node has a lower possibility of leaning so that the support wall 220' can be formed to have a width smaller than that of the support wall 220. Accordingly, a width of the storage node 224' can be increased, resulting in increased capacitance.

Figure 11:
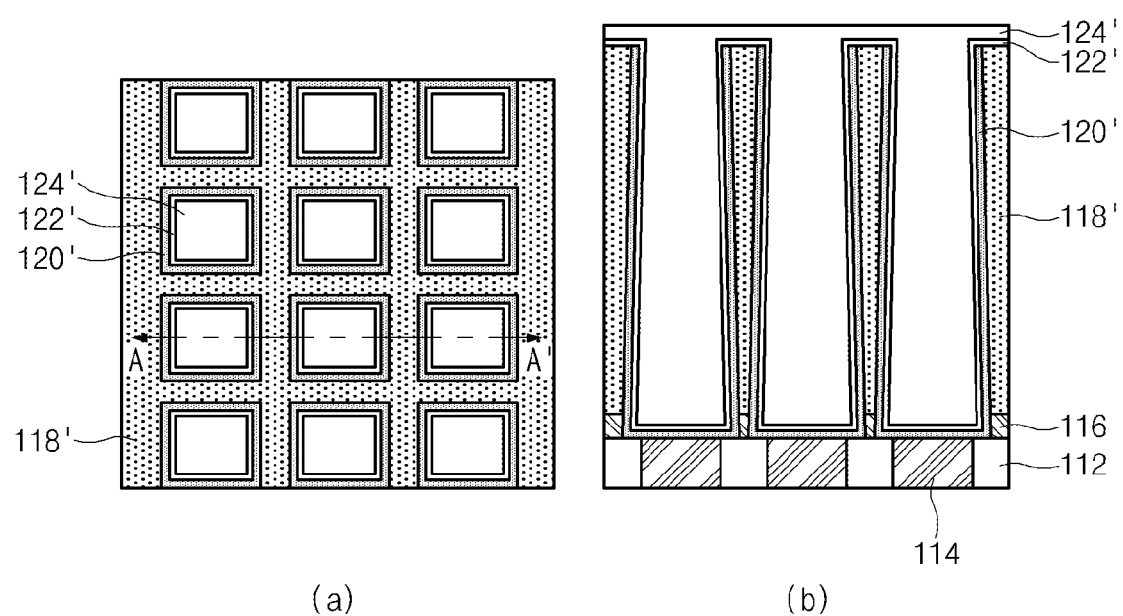
FIG. 11 illustrates a semiconductor device according to another embodiment of the present invention.

FIG. 11 illustrates a semiconductor device according to another embodiment of the present invention. The dielectric layer 122 is formed over inner and outer surfaces of the storage node 120 in FIG. 1, resulting in formation of a cylindrical capacitor. However, in an embodiment, the dielectric layer 122' is formed only over an inner surface of the storage node 120' as shown in FIG. 11, so that a concave-type capacitor may be formed. If the capacitor is formed in a concave shape, a support wall 118' may be formed to enclose a storage node 120'. Therefore, in comparison with FIG. 1, a support layer 118' may be formed to have a smaller thickness than the support wall 118, so that a storage node 120' is formed to have a wider width than the storage node of the embodiment shown in FIG. 1. In such an embodiment, support walls 118' may include crossing lines in both the first and second directions, forming a matrix or mesh shape around capacitors.

A method for forming the semiconductor device shown in FIG. 11 is identical to those of FIGS. 2 to 4, and a first space region and a second space region are reduced in size. In FIG. 5, the trench of the second space region is buried with the same material as the support wall 220 instead of the sacrificial isolation film 222. Subsequently, after the conductive film 224 is formed at an inner surface of the trench T2 as shown in FIGS. 6 and 7, the dielectric layer 228 and the plate storage 230 are sequentially formed over the storage node.

Figure 12:
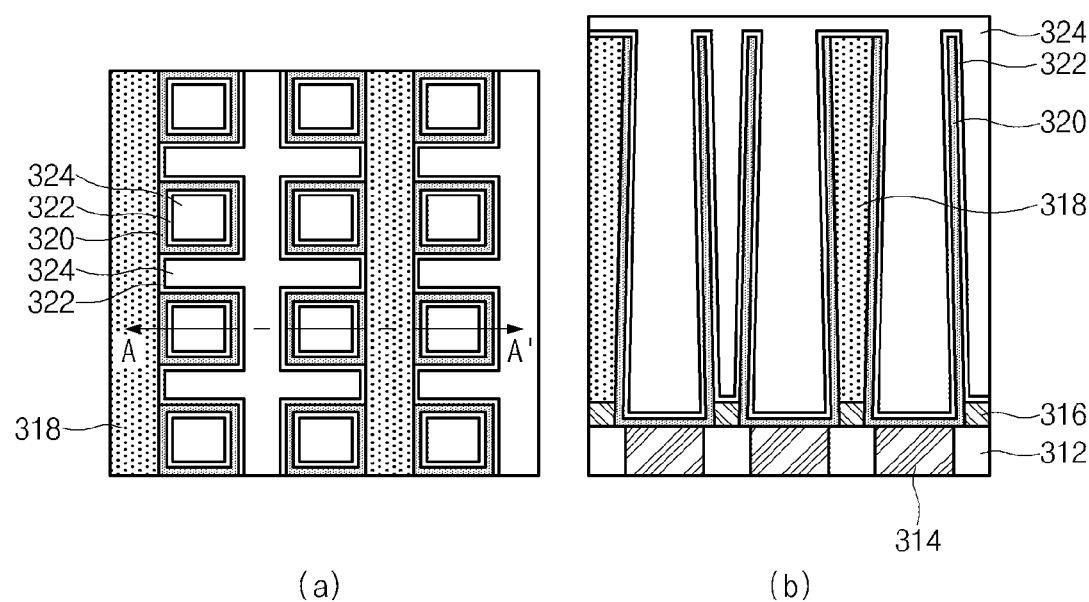
FIG. 12 illustrates a semiconductor device according to another embodiment of the present invention.

FIG. 12 illustrates a semiconductor device according to another embodiment of the present invention. FIG. 12(a) is a plan view illustrating the exemplary semiconductor device, and FIG. 12(b) is a cross-sectional view illustrating the semiconductor device taken along the line A-A' of FIG. 12(a).

In comparison with the embodiment shown in FIG. 1, a support wall 318 of the embodiment shown in FIG. 12 is formed only on one side of storage node 320.

In an embodiment, a dielectric layer 322 and a plate electrode 324 formed over an outer wall of the storage node 320 are formed to enclose three sides of the storage node 320, so that capacitance of the embodiment shown in FIG. 12 is increased compared to the embodiment of FIG. 1. The plate electrode 324 formed over the support wall 318 is not shown in (a) of FIG. 12 for our convenience as well as your easy reference.

An interlayer insulation film 312, a storage node contact 314, and the etch stop film 316 shown in FIG. 12 may be the same as those shown in FIG. 1.

FIGS. 13 to 20 illustrate a method for manufacturing the embodiment of the semiconductor device shown in FIG. 12. In FIGS. 13 to 20, (a) is a plan view illustrating a semiconductor device, and (b) is a cross-sectional view illustrating the semiconductor device taken along the line A-A'. The semiconductor device fabrication processes shown in FIGS. 13 to 20 is similar to those of FIGS. 2 to 9. For convenience of description and better understanding of the present invention, the following description omits certain aspects of an exemplary method which are the same as those of FIGS. 2 to 9, and focuses on the differences between the methods.

Figure 13:
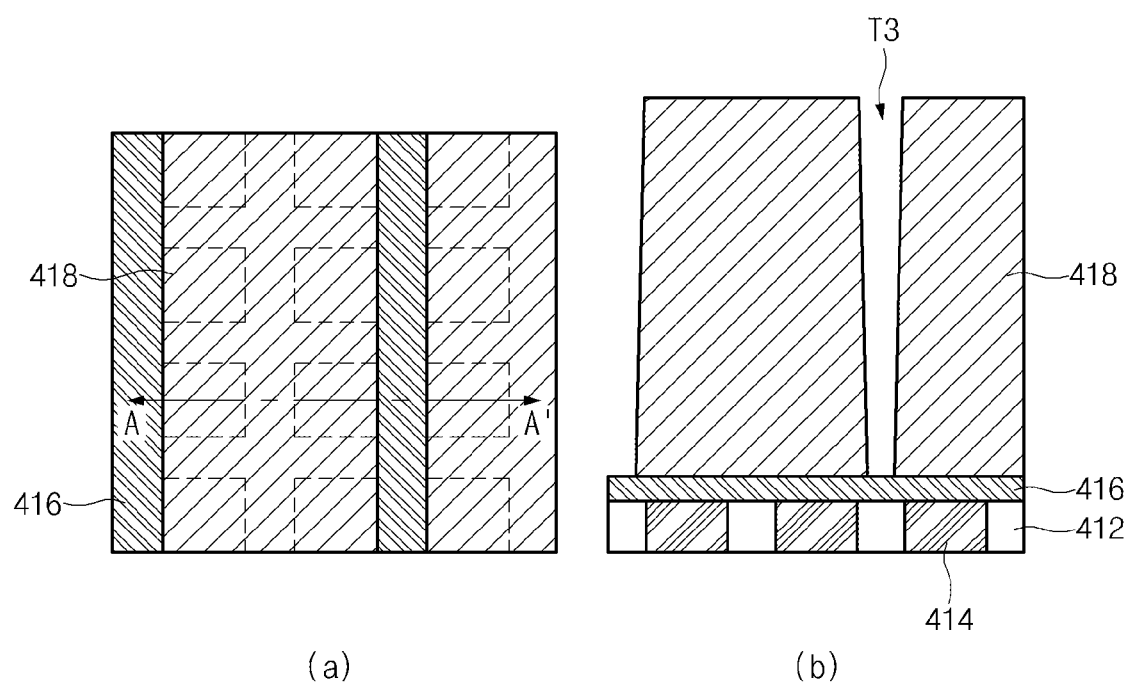
FIGS. 13 to 20 illustrate a method for manufacturing the semiconductor device shown in FIG. 12.

Referring to FIG. 13, a lower structure that includes a gate electrode (i.e., word line, not shown), a landing plug (not shown), a bit line (not shown), an interlayer insulation film 412, and a storage node contact 414, is formed over a semiconductor substrate (not shown) including a device isolation film defining the active region. In an embodiment, the storage node contact 414 is formed to expose its own top surface.

Subsequently, an etch stop film 416 and a mold layer 418 are sequentially formed over a lower structure in which a top surface of the storage node contact 414 is exposed.

After that, a photoresist pattern (not shown) defining a specific region (i.e., a third space region) located on one side of the storage node is formed over a mold layer 418. The photoresist pattern is formed along the first direction, and defines spaces between neighboring rows of storage nodes which are formed in subsequent steps. The future location of the storage nodes is shown in by the dotted lines in FIG. 13. While the first space region shown in embodiment of FIG. 2 is formed to define space regions located on both sides of a row of storage nodes, in the embodiment of FIG. 13, the third space region is formed to define a space region located only on one side of each row of storage nodes.

Subsequently, the mold layer 418 is etched until an etch stop film 416 is exposed using the photoresist pattern as an etch mask, resulting in formation of a trench T3.

Figure 14:
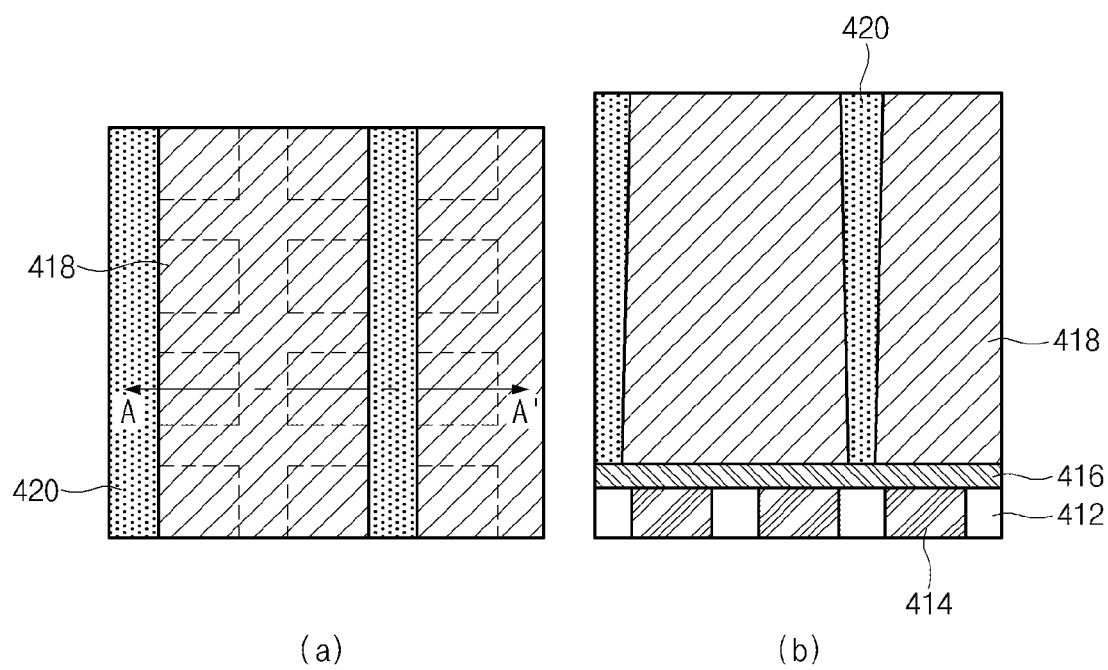

Referring to FIG. 14, after an insulation film is formed to bury the trench T3, the insulation film is planarized until the mold layer 418 is exposed, such that a support wall 420 is formed.

Figure 15:
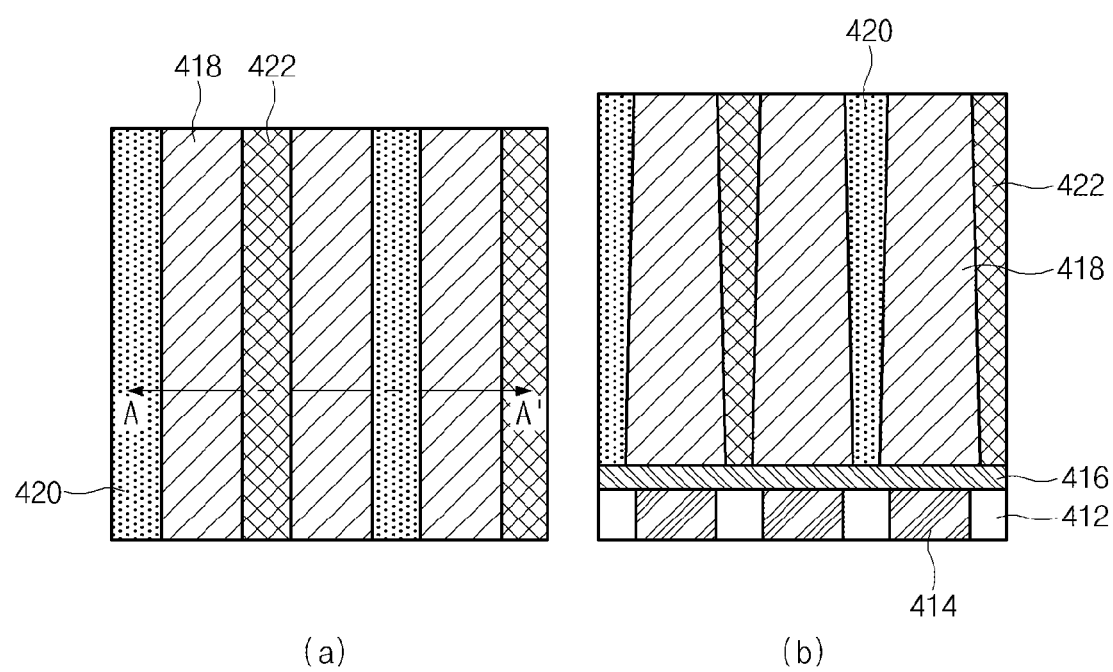

Referring to FIG. 15, a photoresist pattern (not shown), that defines a specific region (i.e., a fourth space region) is formed over the mold layer 418 and the support wall 420. Like the photoresist pattern used to define support wall 318, the present photoresist pattern is arranged in the first direction on a second side of a row of storage nodes, which is the side where the support wall 318 is not present. Subsequently, the mold layer 418 is etched until an etch stop film 416 is exposed using the photoresist pattern as an etch mask so that a trench (not shown) is formed, and a first sacrificial isolation film 422 is formed in the trench.

A first sacrificial isolation film 422 may be formed of a material which has a selectivity ratio that is lower than the selectivity ratio of the mold layer 418 and is higher than the selectivity ratio of the support wall 420. For example, the first sacrificial isolation film 422 may be formed of silicon, boron-doped silicon, or SiGe.

Figure 16:
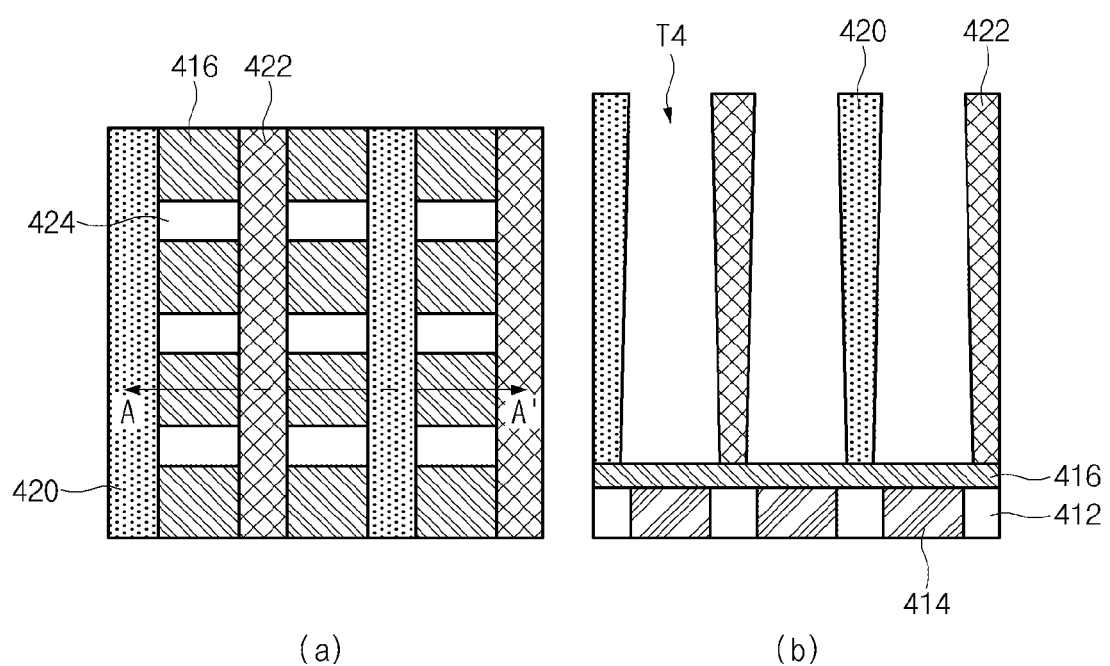

Referring to FIG. 16, the mold layer 418 is etched until the etch stop film 416 is exposed. In an embodiment, a mask comprising a line pattern running in the second direction, which is orthogonal to the first direction of the support walls 420, is applied prior to etching, so that holes are etched rather than lines. That is, a portion of mold layer 418 is selectively removed from a region (i.e., fifth space region) disposed between areas that will be occupied by storage nodes.

In an embodiment, etching the mold layer 418 in the second space region may be achieved using a selectivity ratio between the support wall 420 and the mold layer 418. Thus, in an embodiment, second spaces may be created using line masks and the selectivity ratio, rather than hole masks.

Subsequently, a second sacrificial isolation film 424 is formed to bury the trench of the second space region. In an embodiment, the second sacrificial isolation film 424 may be formed of the same material as the first sacrificial isolation film 422.

Subsequently, remaining portions of mold layer 418 are removed (dipped out) to expose the etch stop film 416 using the selectivity ratio between the mold layer 418 and the support wall 420, and selectivity ratios between the mold layer 418 and the first sacrificial isolation film 422, and the mold layer 418 and the second sacrificial isolation film 424, resulting in formation of a trench T4.

Figure 17:
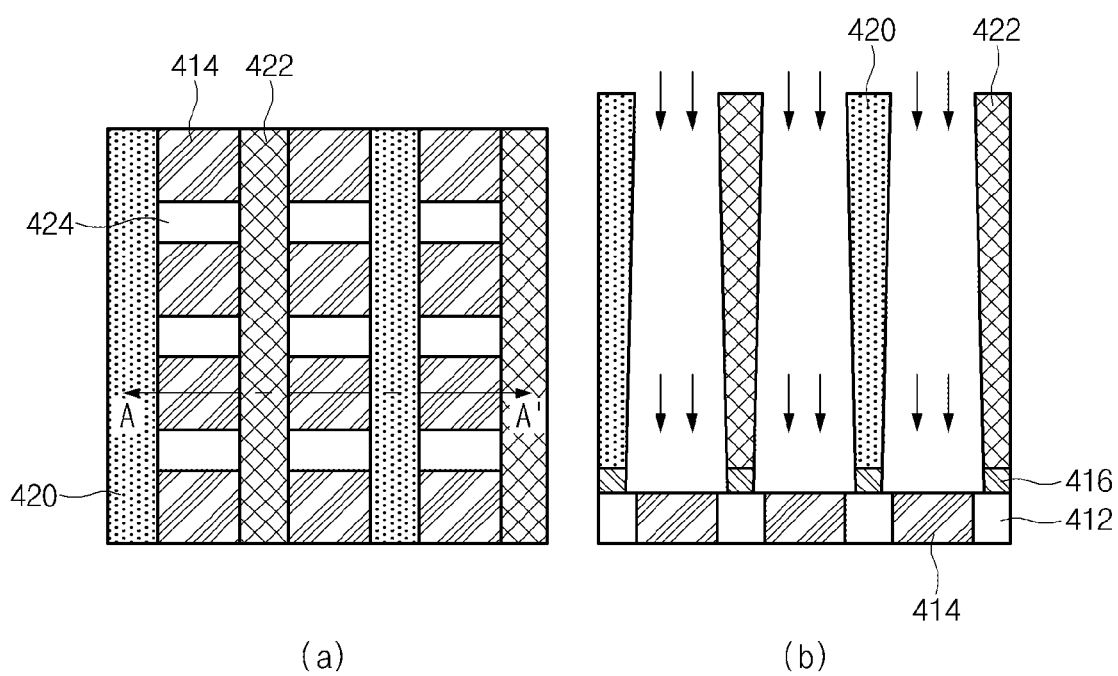

Referring to FIG. 17, portions of the etch stop film 416 exposed through the trench T4 are removed so that the storage node contact 414 is exposed. In an embodiment, the etch stop film 416 may be removed by a dry etching process.

Figure 18:
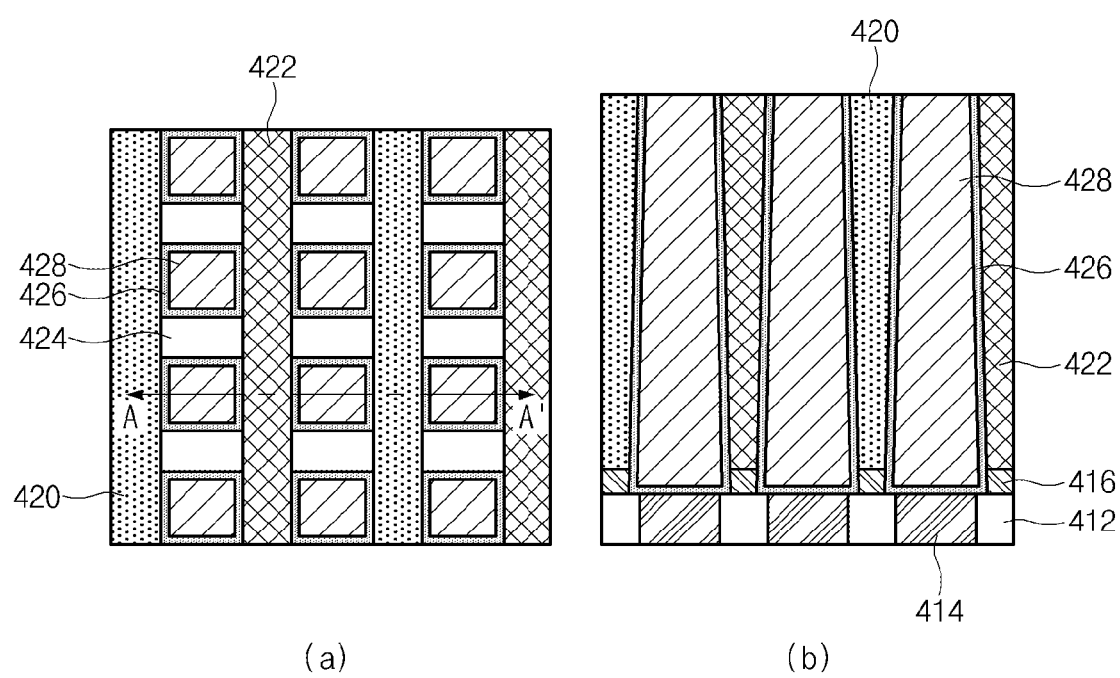

Referring to FIG. 18, the conductive film 426 to be used as an electrode of the capacitor is formed over inner surfaces of the trench T4 including the storage node contact 414.

Then, after an insulation film 428 is formed over the conductive film 426 to bury the trench T4, the insulation film 428 and the conductive film 426 are etched/planarized using an etchback or CMP process until the support wall 420 is exposed, such that the conductive film 426 of each storage node is isolated. The resultant isolated conductive film serves as a second electrode of a storage node. In an embodiment, the insulation film 428 may be an oxide film.

Figure 19:
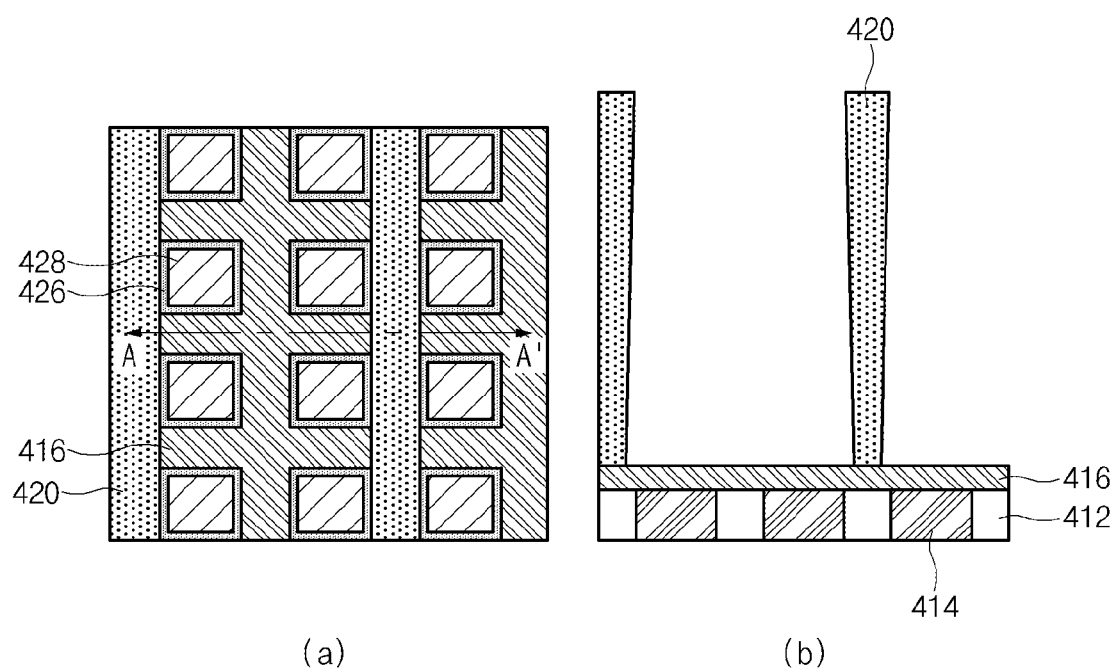

Referring to FIG. 19, the first sacrificial isolation film 422 formed in a fourth space region and the second sacrificial isolation film 424 formed in a fifth space region are removed by a wet dip process.

Referring to FIG. 20, the insulation film 428 is removed by a wet dip process. Subsequently, a dielectric layer 430 is deposited over the conductive film 426 using an Atomic Layer Deposition (ALD) process. The dielectric layer 430 may be formed over all exposed surfaces of conductive film 426, as well as exposed portions of etch stop 416 disposed between neighboring storage nodes, and outer sidewalls of the storage nodes which are not in contact with support wall 420.

Then, a conductive film is formed over the dielectric layer 430, resulting in formation of a plate electrode 432.

Although the present invention has been disclosed by referring to the above-mentioned embodiments, it should be noted that the aforementioned embodiments have been disclosed for only illustrative purposes, and those skilled in the art will appreciate that various modifications, additions and substitutions are possible, without departing from the scope and spirit of the invention as disclosed in the accompanying claims. Thus, it is intended that the present invention covers the modifications and variations of this invention provided they come within the scope of the appended claims and their equivalents.

As is apparent from the above description, embodiments of the present invention form a support wall between storage nodes to prevent a capacitor from leaning, and form storage nodes using a damascene process, such that a contact area between each storage node and a storage node contact is increased, thereby reducing resistance and alignment problems.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a first storage node;
   a second storage node spaced apart from and next to the first storage node along a first direction;
   a third storage node spaced apart from and next to the first storage node along a second direction crossing the first direction, the first, second and third storage nodes being included in a plurality of storage nodes;
   a support wall located between the first storage node and the third storage node so as to contact the first storage node and the second storage node; and
   a dielectric layer and a plate electrode disposed in a storage node region, and in a space between the first and second storage nodes,
   wherein the plurality of storage nodes, the dielectric layer and the plate electrode are elements of a capacitor.

2. The semiconductor device according to claim 1, wherein the support wall is formed to have a line-type barrier structure arranged along the first direction.

3. The semiconductor device according to claim 1, wherein a width of a lower portion of each of the plurality of storage nodes is greater than the width of an upper portion of each of the plurality of storage nodes.

4. The semiconductor device according to claim 1, wherein the storage node has a pillar-type structure in which a width of a lower portion of each of the plurality of storage nodes is greater than the width of an upper portion of each of the plurality of storage nodes.

5. The semiconductor device according to claim 1, wherein the support wall is disposed on a first side of the first and second storage nodes, the semiconductor device further comprising a second support wall disposed on a second side of the first and second storage nodes opposite to the first side.

6. The semiconductor device of claim 1, wherein the dielectric layer and the plate electrode are disposed over inner and outer sidewalls of the first and second storage nodes that face the first direction.

7. The semiconductor device of claim 1, wherein the plate electrode and the dielectric layer are disposed over the support wall.

8. The semiconductor device of claim 1, wherein an etch stop film defines a bottom surface of the space, and a level of an upper surface of the etch stop film is above a level of a bottom surface of the storage node.

9. The semiconductor device of claim 1, wherein the dielectric layer and the plate electrode fill the space between the first and second storage nodes.

10. The semiconductor device of claim 1, wherein a width of the space in the first direction is less than a width of the first storage node in the first direction, and
    wherein the width of the space is less than a width of the second storage node in the first direction.

11. The semiconductor device of claim 1, wherein the dielectric layer and the plate electrode are disposed over inner and outer sidewalls of each sidewall of the first and second storage nodes that face the first direction, and
wherein the support wall fills the space between the first and third storage nodes in the second direction.

12. A semiconductor device comprising:
a first storage node and a second storage node spaced apart from each other by a predetermined distance, the first storage node being next to the second storage node and separated from the second storage node by a space;
a support wall configured to contact sidewalls of the first storage node and the second storage node; and
a dielectric layer and a plate electrode located in the space between the first storage node and the second storage node,
wherein the first and second storage nodes, the dielectric layer and the plate electrode are elements of a capacitor.

13. The semiconductor device according to claim 12, wherein the support wall is configured to contact one sidewall of each of the first storage node and the second storage node.

14. The semiconductor device according to claim 12, wherein the support wall contacts two sidewalls of each of the first storage node and the second storage node.

15. The semiconductor device according to claim 12, wherein the support wall has a line-type barrier structure arranged along a first direction.

16. The semiconductor device according to claim 12, wherein a width of a lower portion of the first and second storage nodes is greater than a width of an upper portion of the first and second storage nodes.

17. The semiconductor device according to claim 12, wherein the storage node has a pillar-type structure in which a width of a lower portion of the first and second storage nodes is greater than the width of an upper portion of the first and second storage nodes.

18. The semiconductor device according to claim 12, wherein the support wall is disposed on a first side of the first and second storage nodes, and a second support wall is disposed on a second side of the first and second storage nodes opposite to the first side.

19. The semiconductor device of claim 12, wherein an etch stop film is disposed under the support wall, and a bottom surface of the etch stop film is level with a bottom surface of the storage node.

20. The semiconductor device of claim 12, wherein the plate electrode and the dielectric layer are disposed over the support wall.

* * * * *